US005477222A

United States Patent [19]
Kahlman et al.

[11] Patent Number: 5,477,222
[45] Date of Patent: Dec. 19, 1995

[54] DEVICE FOR ENCODING/DECODING N-BIT SOURCE WORDS INTO CORRESPONDING M-BIT CHANNEL WORDS, AND VICE VERSA

[75] Inventors: Josephus A. H. M. Kahlman; Kornelis A. Schouhamer Immink, both of Eindhoven, Netherlands

[73] Assignee: U.S. Philips Corporation, New York, N.Y.

[21] Appl. No.: 223,875

[22] Filed: Apr. 6, 1994

[30] Foreign Application Priority Data

May 4, 1993 [EP] European Pat. Off. ............. 93201264

[51] Int. Cl.[6] .................................................. H03M 7/00
[52] U.S. Cl. .......................................................... 341/95
[58] Field of Search ............................. 341/95, 68, 69, 341/67, 58; 360/48, 51

[56] References Cited

U.S. PATENT DOCUMENTS 4,337,458  6/1982  Cohn et al. .............................. 340/347
4,547,890  11/1985  Gindi .......................................... 375/19

OTHER PUBLICATIONS

"Coding Techniques for Digital Recorders" by K. A. Schouhamer Immink, Chapter 5.6.7, pp. 127 to 131, Prentice Hall (1991).

Bell System Technical Journal, "Spectrum of a Binary Signal Block Coded for DC Suppression", vol. 53, No. 6, pp. 1103–1106, 1974.

Primary Examiner—Brian K. Young
Attorney, Agent, or Firm—Edward W. Goodman

[57] ABSTRACT

A device for encoding a stream of databits of a binary source signal (S) into a stream of databits of a binary channel signal (C), wherein the bitstream of the source signal is divided into n-bit source words ($x_1$, $x_2$), which device includes a converting circuit (CM) adapted to convert the source words into corresponding m-bit channel words ($y_1$, $y_2$, $y_3$). The converting circuit (CM) is further adapted to convert n-bit source words into corresponding m-bit words, such that the conversion for each n-bit source word is parity preserving (table I). The relations hold that $m > n \geq 1$, $p \geq 1$, and that p can vary. Preferably, $m = n + 1$. Further, a decoding device is disclosed for decoding the channel signal obtained by means of the encoding device.

11 Claims, 3 Drawing Sheets

DEVICE FOR ENCODING/DECODING N-BIT SOURCE WORDS INTO CORRESPONDING M-BIT CHANNEL WORDS, AND VICE VERSA

BACKGROUND OF THE INVENTION

1. Field of the Invention

The invention relates to a device for encoding a stream of databits of a binary source signal into a stream of databits of a binary channel signal, wherein the bitstream of the source signal is divided into n-bit source words, which device comprises converting means adapted to convert said source words into corresponding m-bit channel words. The invention also relates to a device for decoding a stream of data bits of a binary channel signal obtained by means of the encoding device, so as to obtain a stream of databits of a binary source signal.

2. Description of the Related Art

An encoding device mentioned in the foregoing is known from the book 'Coding techniques for digital recorders' by K. A. Schouhamer Immink, chapter 5.6.7, pp. 127 to 131, Prentice Hall (1991). The book discusses an encoder for generating a (d,k) sequence which satisfies the parameters: rate ⅔, (1,7), which encoder is also proposed by Cohn et al in U.S. Pat. No. 4,337,458. The known encoding scheme suffers from the presence of a DC level which may become excessively large and therefore introduces distortion in communication systems which can not handle a DC component, as well as distortion in any recording of data in magnetic media.

SUMMARY OF THE INVENTION

The invention has for its object to provide a device for encoding n-bit source words into corresponding m-bit channel words, such that it itself does not generate a DC component in the channel signal, whereas further it provides the possibility, by means of additional measures to be taken, to realize a channel signal in the form of a (d,k) sequence.

The device in accordance with the invention is characterized in that the converting means are adapted to convert a block of p consecutive n-bit source words into a corresponding block of p consecutive m-bit channel words, such that the conversion for each block of p consecutive n-bit source words is parity preserving, where n, m and p are integers, $m>n \geq 1$, $p \geq 1$, and where p can vary. 'Parity preserving' means that the parity of the n-bit source words to be converted equal the parity (after modulo-2 addition) of the corresponding m-bit channel words in which they are converted. As a result, the n-to-m conversion device as claimed does not influence the polarity of the signal. The conversion is such that, by itself, it does not generate a DC component in the channel signal.

The encoding device in accordance with the invention can be used in combination with a bit-adder unit in which one bit is added to code word of a certain length. The signal obtained can be applied to the encoding device of the present invention. The channel signal of the encoding device is applied to a 1T precoder. The purpose of the bit-adder unit is to add a '0'- or a '1'-bit to the consecutive code words included in the input signal of the converter, so as to obtain a precoder output signal which is DC free, or includes a tracking pilot signal having a certain frequency. The precoder output signal is recorded on a record carrier. The adding of a '0'-bit in the input signal of the converter results in the polarity of the output signal of the 1T precoder remaining the same. The adding of a '1'-bit results in a polarity inversion in the output signal of the 1T precoder. The converter therefore influences the output signal of the 1T precoder such that the running digital sum value of the output signal of the 1T precoder can be controlled so as to have a desired pattern as a function of time.

Because of the fact that the encoding device in accordance with the invention realizes a parity-preserving encoding, it does not influence the polarity of the signal it encodes and can therefore be used in combination with the bit-adder unit without the need of any modification.

Preferably, m equals n+1, and n is equal to 2. For n being equal to 1 or 2, the device in accordance with the invention can be used, with additional measures to be taken, as will become apparent later, for generating channel signals in the form of a (d,k) sequence, where d=1. Higher values for n do not allow for the generation of a (l,k) sequence. Further, n=1, which means that 1-bit source words are converted into 2-bit channel words, results in an increase of 100% in bits in the channel signal generated by the device. Contrary to this, a conversion of 2-bit source words into 3-bit channel words results in an increase of only 50%, and is therefore more advantageous.

Various conversions of 2-bit source words into 3-bit channel words are possible, that have the parity preserving character. It should however be noted that various permutations of the channel codes in the table are possible, namely in total 4.

The device in accordance with the invention, wherein the converting means are adapted to convert 2-bit source words into corresponding 3-bit channel words, so as to obtain a channel signal in the form of a (d,k) sequence, where d=1, the device further comprising means for detecting the position in the bitstream of the source signal where encoding of single 2-bit source words into corresponding single channel words would lead to a violation of the d-constraint at the channel word boundaries and for supplying a control signal in response to said detection, may be further characterized in that in the absence of the control signal, the converting means are adapted to convert single 2-bit source words into corresponding single 3-bit channel words, such that the conversion for each 2-bit source word is parity preserving. More specifically, the device is characterized in that, in the presence of said control signal, the converting means are further adapted to convert the block of said two subsequent 2-bit source words into a corresponding block of two subsequent 3-bit channel words, such that the conversion for said block of two subsequent 2-bit source words is parity preserving. The measure to convert one (say: the second one) of two subsequent source words into a 3-bit word not identical to the four channel words $CW_1$ to $CW_4$, offers the possibility to detect at the receiver side that a situation existed that encoding of single source words into corresponding single channel words would have led to a violation of the d=1 constraint. The encoder now encodes a block of two 2-bit source words into a block of 2 3-bit channel words, such that the encoding of the block is parity preserving, whilst the d=1 constraint is satisfied as well.

To embody the encoding of blocks of two 2-bit source words, the device in accordance with the invention may be characterized in that the converting means are adapted to convert the blocks of two consecutive 2-bit source words into the blocks of two consecutive 3-bit channel words in accordance with the coding given in the following table:

| block of 2 source words | block of 2 channel words |
|---|---|
| 00 00 | 100 010 |
| 00 01 | 101 010 |
| 10 00 | 000 010 |
| 10 01 | 001 010 |

The device in accordance with the invention, for generating a (d,k) sequence, wherein k has a value larger than 5, the device being further provided with means for detecting the position in the bitstream of the source signal where encoding of single 2-bit source words into single 3-bit channel words would lead to a violation of the k-constraint and for supplying a second control signal in response to said detection, may be further characterized in that, in the presence of the second control signal, occurring during the conversion of three consecutive 2-bit source words, the converting means are adapted to convert a block of said three consecutive 2-bit source words into a block of corresponding three consecutive 3-bit channel words, such that the conversion for said block of three 2-bit source words is parity preserving, the converting means are further adapted to convert two of the three source words in the block into corresponding 3-bit channel words not identical to the four channel words $CW_1$ to $CW_4$, in order to preserve the k constraint. This measure enables an encoding of a block of three 2-bit source words into a block of three 3-bit channel words so as to satisfy the k-constraint, and such that the encoding is still parity preserving. The measure to convert two (say: the second and the third one) of three subsequent source words into a 3-bit word not identical to the four channel words $CW_1$ to $CW_4$, offers the possibility to detect at the receiver side that a situation existed that the encoding of single 2-bit source words into corresponding single 3-bit channel words would have led to a violation of the k constraint. Upon detection, the decoder is capable of decoding the block of three 3-bit channel words into the corresponding block of three 2-bit source words in the inverse way, as upon encoding.

To embody the encoding of blocks of three 2-bit source words, the device in accordance with the invention may be characterized in that the converting means are adapted to convert blocks of three consecutive 2-bit source words into blocks of three consecutive 3-bit channel words in accordance with the coding given in the following table:

| block of 3 source words | block of 3 channel words |
|---|---|
| 11 11 11 | 000 010 010 |
| 11 11 10 | 001 010 010 |
| 01 11 10 | 101 010 010 |
| 01 11 11 | 100 010 010 |

A device for decoding a stream of data bits of a binary channel signal into a stream of databits of a binary source signal, wherein the bitstream of the channel signal is divided into m-bit channel words, which device comprises deconverting means adapted to deconvert m-bit channel words into corresponding n-bit source words, is characterized in that, the deconverting means are adapted to deconvert a block of p consecutive m-bit channel words into a corresponding block of p consecutive n-bit source words, such that the conversion for each block of p consecutive m-bit channel words is parity preserving, where n, m and p are integers, m>n, p≧1, and where p can vary.

It should be noted that published European patent application 199.088A2 discloses a converter for converting n-bit source words into a channel signal in the form of a sequence of m-bit channel words, which channel signal is DC free. The conversion is however not parity preserving.

The invention will be further described in the following figure description, in which.

DESCRIPTION OF THE PREFERRED EMBODIMENTS

Figure 1:
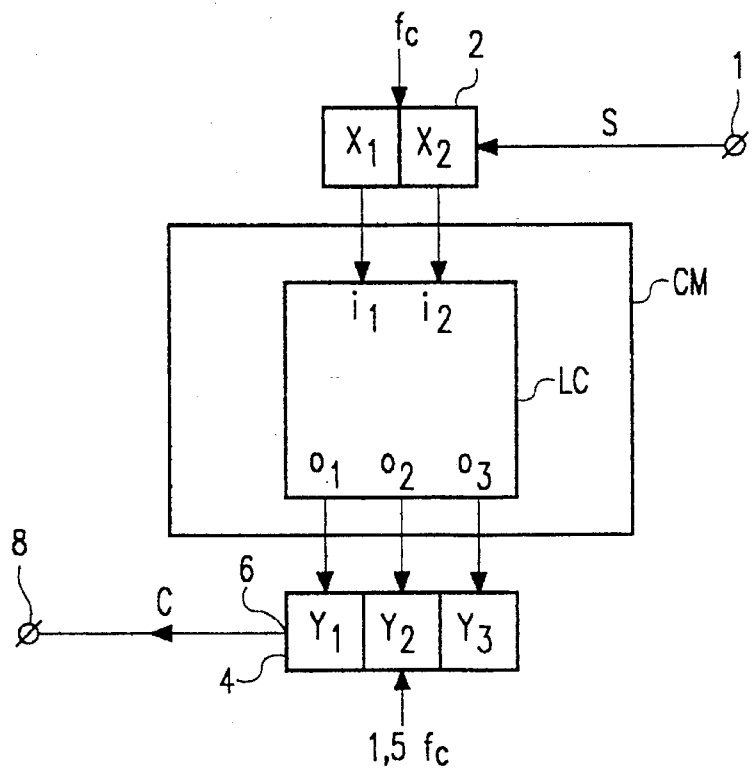
FIG. 1 shows a first embodiment of the invention.

FIG. 1 shows a device having an input terminal 1, for receiving a stream of databits of a binary source signal S. The terminal 1 is coupled to an input of a shift register 2 having two cells $X_1$ and $X_2$ so as to receive two consecutive source bits of the source signal S. The shift register 2 functions as a serial-parallel converter, so as to obtain consecutive 2-bit source words SW. The outputs of the two cells are coupled to two inputs $i_1$, $i_2$ of a logic circuit LC, for supplying the logic values $(x_1,x_2)$ of the source bits present in the cells. The logic circuit LC forms part of conversion means CM.

The device further includes a second shift register 4 having three cells $Y_1$, $Y_2$ and $Y_3$. Outputs $o_1$, $o_2$ and $o_3$ of the logic circuit LC are coupled to inputs of the three cells $Y_1$, $Y_2$ and $Y_3$ respectively of the shift register 4, for supplying the logic values $(y_1,y_2,y_3)$ of the channel words. An output 6 of the shift register 4 is coupled to an output terminal 8. The shift register 4 functions as a parallel-serial converter, so as to convert the 3-bit channel words CW supplied by the logic circuit LC into a serial stream of databits of a binary channel signal C.

The logic circuit LC in the conversion means CM is adapted to convert consecutive 2-bit source words SW into 3-bit channel words, such that the conversion for each 2-bit source word is parity preserving. That means that the number of 'ones' in the source word to be converted equals the number of 'ones' in the corresponding channel word, a modulo-2 addition on the 'ones' in the channel word being carried out. Or, otherwise said: if the number of 'ones' in the source word is even, the number of 'ones' in the channel word will be even. And: if the number of 'ones' in the source word is odd, the number of 'ones' in the channel word will be odd.

As an example, the converting means LC is adapted to convert the 2-bit source words SW into 3-bit channel words CW in accordance with the following table:

TABLE I

| source word $(x_1,x_2)$ | | channel word $(y_1,y_2,y_3)$ | |
|---|---|---|---|
| $SW_1$ | 00 | $CW_1$ | 101 |
| $SW_2$ | 01 | $CW_2$ | 100 |
| $SW_3$ | 10 | $CW_3$ | 001 |
| $SW_4$ | 11 | $CW_4$ | 000 |

It should be noted here, that the first bit in the source word is applied first to the shift register 2 and that the first bit in the channel word is supplied first from the output 6 of the shift register 4.

The bitstream of the channel words is in NRZI (non-return to zero-inverse) notation, which means that a 'one' results in a transition in the write current for recording the channel signal on a magnetic record carrier.

The device of FIG. 1 can be used to generate a channel signal C in the form of a (d,k) sequence satisfying the d=1 constraint. That means that at least one 'zero' is present between two subsequent 'ones' in the serial datastream of the channel signal. That is, that a concatenation of two or more 'ones' in the channel signal is prohibited.

It might occur that the unmodified conversion, such as by means of the device of FIG. 1, of combinations of two subsequent 2-bit source words might violate the d=1 constraint. Those combinations are the combinations; '00 00', which by unmodified conversion would lead to the two 3-bit channel words '101 101'; '00 01', which by unmodified conversion would lead to the two 3-bit channel words '101 100'; '10 00', which by unmodified conversion would lead to the two 3-bit channel words '001 101' and '10 01', which by unmodified conversion would lead to the two 3-bit channel words '001 100'.

The occurrence of such combinations should be detected so that a modified encoding of blocks of two 2-bit source words into blocks of two 3-bit channel words can take place. A modified embodiment of a device of FIG. 1 which is, in addition to the 'normal' encoding of 2-bit source words into 3-bit channel words, capable of detecting the above identified combinations, and is capable of realizing a modified encoding, such that the d=1 constraint in the channel signal is still satisfied, is shown in FIG. 2a.

Figure 2A:
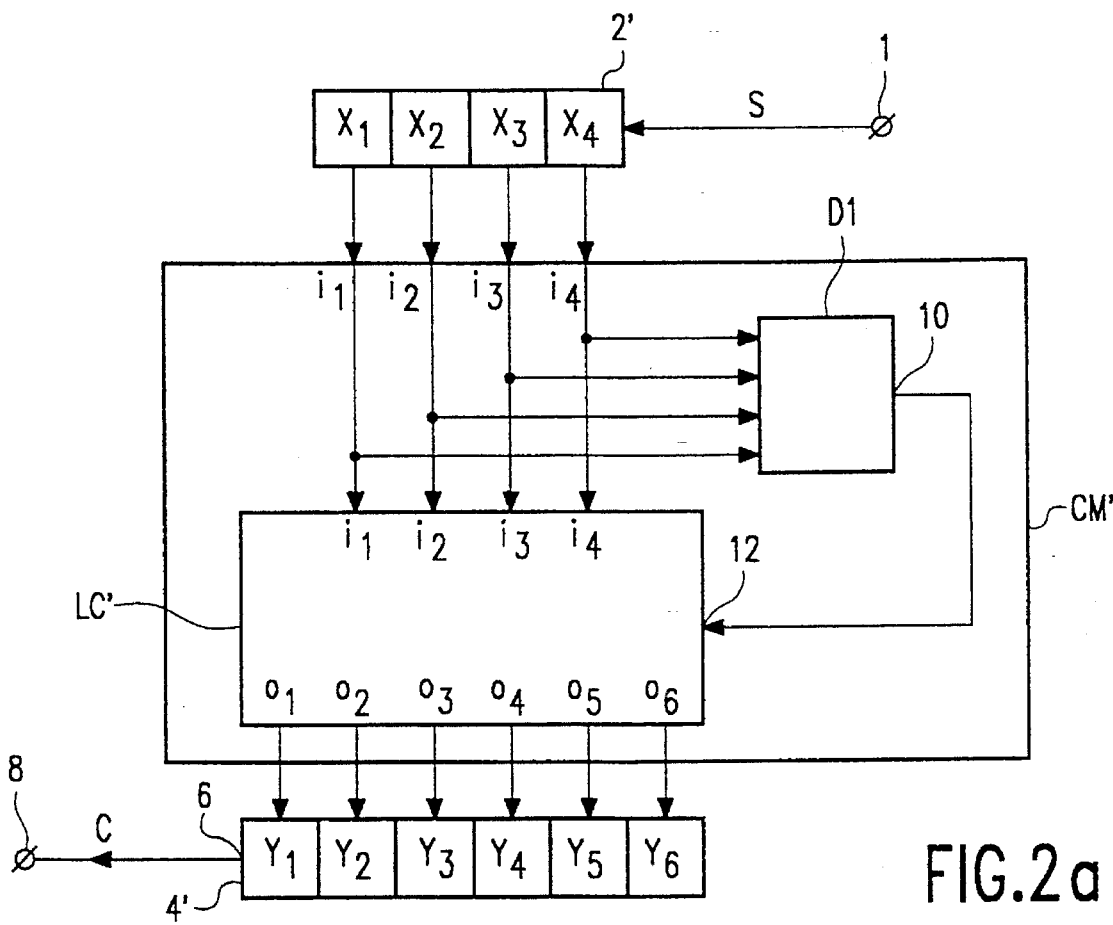
FIG. 2a shows a second embodiment of the invention.

The device of FIG. 2a includes a shift register having four cells $X_1$ to $X_4$ so as to receive four consecutive bits $(x_1,x_2,x_3,x_4)$ of the serial bitstream of the source signal S. Outputs of the four cells are coupled to corresponding inputs $i_1$ to $i_4$ respectively of the conversion means CM'. The conversion means CM' comprise detector means D1. The detector means D1 are adapted to detect the position in the serial bitstream of the source signal where unmodified encoding of single source words in the bitstream into corresponding single channel words would lead to a violation of the d=1 constraint in the channel signal C, and are adapted to supply a control signal at its output 10 in response to such detection.

The outputs of the four cells are also coupled to four inputs $i_1$ to $i_4$, respectively, of logic circuit LC'. The output 10 of the detector means D is coupled to a control signal input 12 of the logic circuit LC'. The logic circuit LC' has six outputs $o_1$ to $o_6$, which are coupled to inputs of cells $Y_1$ to $Y_6$, respectively, of second shift register 4'.

In the absence of a control signal at the control signal input 12, the logic circuit LC' converts the first 2-bit source word '$x_1\ x_2$' into the three bit channel word '$y_1\ y_2\ y_3$' in conformity with table I given above. As soon as the detector circuit D1 detects a combination of two 2-bit source words $(x_1,x_2,x_3,x_4)$ which equals one of the combinations given above, the logic circuit LC' converts the combination in accordance with the modified coding as given in the following table:

TABLE II

| source words | unmodified coding | modified coding |
|---|---|---|
| 00 00 | 101 101 | 100 010 |
| 00 01 | 101 100 | 101 010 |
| 10 00 | 001 101 | 000 010 |
| 10 01 | 001 100 | 001 010 |

As can be seen from the table, unmodified conversion of the single two 2-bit source words leads to a violation of the d=1 constraint, as two 'ones' occur at the boundary between the two channel words obtained. The logic circuit LC' is therefore adapted to convert in a modified coding mode, the blocks of two 2-bit source words given in the left column of the above table into the blocks of two 3-bit channel words as given in the right column in the above table II. As can be seen, no violation of the d=1 constraint occurs anymore. Moreover, the modified encoding in the same way is parity preserving. This means in the present situation that, if the number of 'ones' in the blocks of two 2-bit source words is odd (even), the number of 'ones' in the block of two 3-bit channel words obtained is odd (even). Further, one of the two 2-bit source words, which is in the above table the second one, is encoded into a 3-bit channel word which is unequal to one of the four channel words of table I. The reason for this is that on the receiver side, a detection of this 3-bit channel word not belonging to the set of four 3-bit channel words of the table I is possible, so that a corresponding decoding, which is the inverse of the encoding as defined with reference to table II, can be realized.

The block of two 3-bit channel words obtained by means of the encoding in conformity with table II, is supplied by the logic circuit LC' to its outputs $o_1$ to $o_6$, which channel words are supplied to the six cells $Y_1$ to $Y_6$ of the shift register 4'. It is clear from the embodiment described that the situations where a modified encoding is needed is detected by means of the detector D1 using the source words.

Figure 2B:
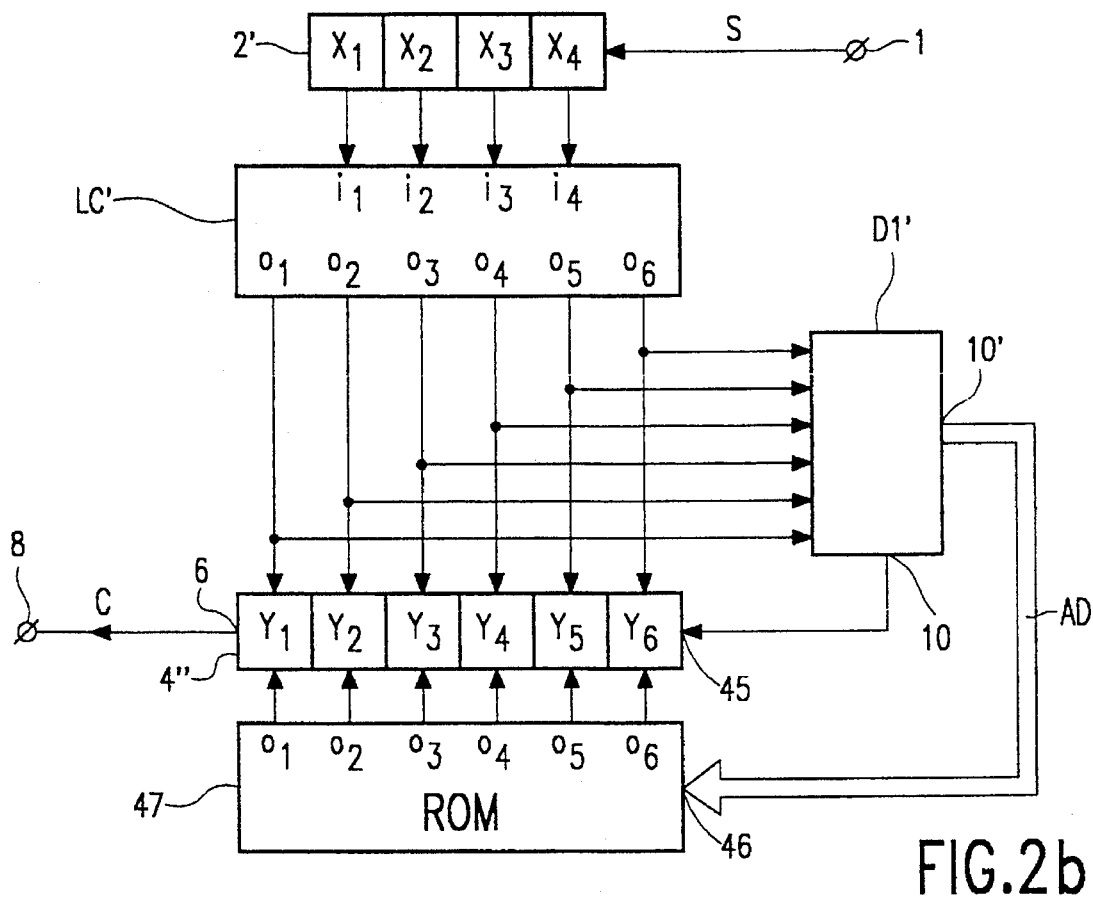
FIG. 2b shows a third embodiment of the invention.

A different construction of the device for carrying out the modified encoding described with reference to the table II is shown in FIG. 2b. In this case, detection of the situations where a modified coding should be carried out is decided using the converted channel words. The device of FIG. 2b includes a detector D1' having 6 inputs for receiving two subsequent 3-bit channel words obtained by means of the unmodified encoding. The detector D1' detects whether the two subsequent 3-bit channel words obtained using the unmodified coding equal one of the four 6-bit sequences given in the middle column under 'unmodified coding' of table II. If so, the detector D1' issues a switching signal at its output 10 and an address signal AD at its output 10'. The switching signal is applied to a switching signal input 45 of the shift register 4". The address signal AD is applied to an address signal input 46 of a ROM 47. The detector D1' generates one of four possible address signals AD1 to AD4, in response to the detection of a corresponding one of the four 6-bit sequences in the middle column of table II. As an example, the address signal AD1 is generated when the detector D1' detects the sequence '101101' and generates the address signal AD4 upon detection of the 6-bit sequence '001100'. The ROM 47 has the 6-bit sequences shown in the right column of table II stored. Upon the receipt of the address signal AD1, the ROM supplies the 6-bit sequence '100 010' at its outputs $o_1$ to $o_6$, and upon the receipt of the address signal AD2, the ROM supplies the 6-bit sequence '101 010' at its outputs. Upon the receipt of the address signal AD3, the ROM supplies the 6-bit sequence '000 010' at its outputs, and upon the receipt of the address signal AD4, the ROM supplies the 6-bit sequence '001 010' at its outputs. Each memory location of the shift register 4" has now two inputs, one of them being coupled with a corresponding output of the logic circuit LC', the other being coupled to a corresponding output of the ROM 47.

In the normal situation, when the d=1 constraint is not violated, unmodified conversion is carried out, and the switching signal is absent so that the shift register accepts the bits supplied by the logic circuit LC' via the upper inputs of the shift register 4". If the d=1 constraint is violated, the switching signal applied to the switching signal input 45 results in the shift register to accept the 6-bit sequence, which is the modified sequence, applied by the ROM to the lower inputs of the shift register 4".

The k-constraint in a (d,k) sequence means that a concatenation of at most k 'zeroes' between two subsequent 'ones' in the channel signal are allowed.

It might occur that the unmodified conversion of three subsequent 2-bit source words might violate the k-constraint.

As an example: the sequence of source words '11 11 11' would by unmodified conversion lead to the three 3-bit channel words '000 000 000'. If a (d,k) sequence should be obtained where k equals 6, 7 or 8, such combination of three 3-bit channel words should not occur.

Another example is the sequence of source words '11 11 10' which by unmodified conversion would lead to the three 3-bit channel words '000 000 001'. This combination of three 3-bit channel words does not satisfy a k=6 or k=7 constraint. Moreover, this combination of three 3-bit channel words can follow a previous channel word that ends with a '0', so that it might lead to a violation of a k=8 constraint. Further, the combination ends with a '1', so that it might lead to a violation of the d=1 constraint, if the combination is followed by a 3-bit channel word that starts with a '1'. An equivalent reasoning is valid for the sequence of source words '01 11 11'.

A further example is the sequence of source words '01 11 10' which by unmodified conversion would lead to the three 3-bit channel words '100 000 001'. This combination can, in the same way as given above, lead to a violation of the d=1 constraint.

The occurrence of such combinations should be detected so that a modified encoding can take place. An embodiment of a device which is, in addition to the 'normal' encoding of 2-bit source words into 3-bit channel words, capable of detecting the above identified combinations, and is capable of realizing a modified encoding, is shown in FIG. 3.

Figure 3:
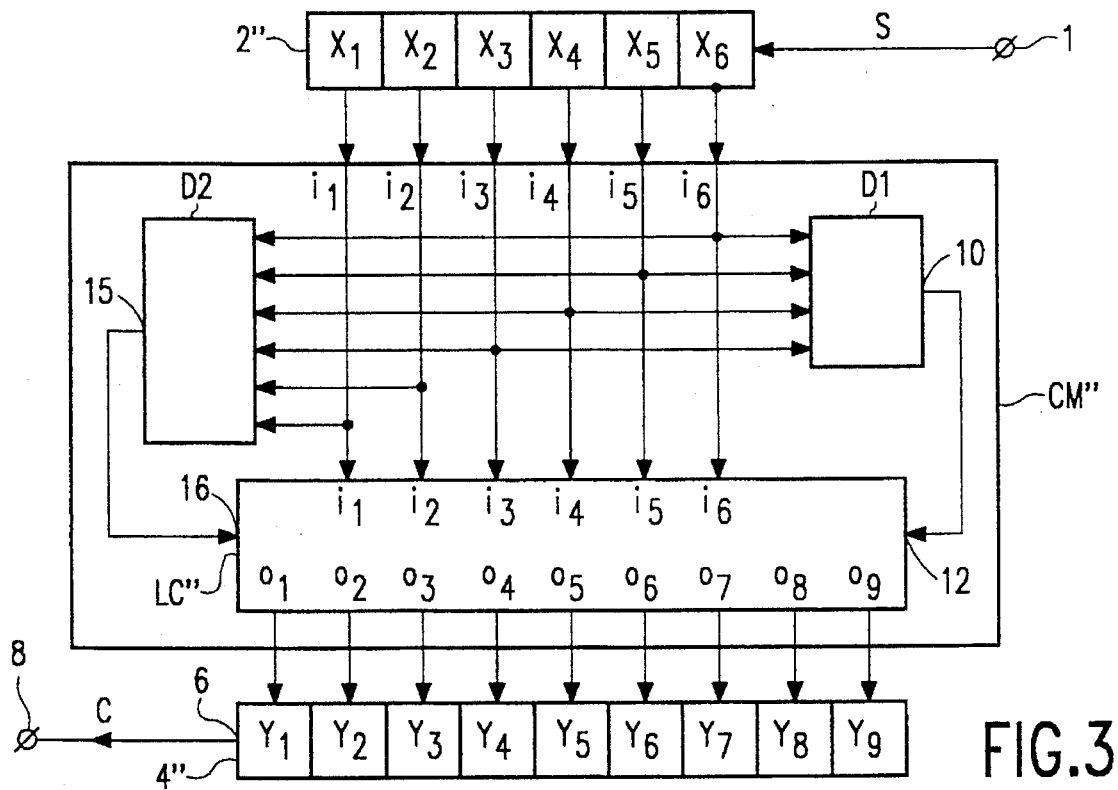
FIG. 3 shows a fourth embodiment of the device.

The device of FIG. 3 includes a shift register 2" having six cells $X_1$ to $X_6$ so as to receive six consecutive bits of the serial bitstream of the source signal S. Outputs of the six cells are coupled to corresponding inputs $i_1$ to $i_6$ respectively of the conversion means CM". The conversion means CM' comprise detector means D2. The detector means D2 are adapted to detect the position in the serial bitstream of the source signal where unmodified encoding of the bitstream would lead to a violation of the k-constraint in the channel signal C, and are adapted to supply a control signal at its output 15 in response to such detection.

The outputs of the six cells are also coupled to four inputs $i_1$ to $i_6$ respectively of logic circuit LC". The output 15 of the detector means D2 is coupled to a control signal input 16 of the logic circuit LC". The logic circuit LC" has nine outputs $o_1$ to $o_9$, which are coupled to inputs of cells $Y_1$ to $Y_9$ respectively of second shift register 4".

In the absence of a control signals at the control signal inputs 12 and 16, the logic circuit LC' converts a single 2-bit source word '$x_1 x_2$' into a single 3-bit channel word '$Y_1 Y_2 Y_3$' in conformity with table I given above. As soon as the detector circuit D1 detects a block of two 2-bit source words '$x_1 x_2, x_3 x_4$' which equals one of the combinations given in table II above, the logic circuit LC" converts the combination in accordance with the conversion rule as given in table II, so as to obtain a block of two 3-bit channel words '$Y_1 Y_2 Y_3 Y_4 Y_5 Y_6$'.

As soon as the detector D2 detects a block of three 2-bit source words '$x_1 x_2 x_3 x_4 x_5 x_6$' which equals one of the combinations given above, the logic circuit LC" converts the block in accordance with the modified coding as given in the following table, so as to obtain a block of three 3-bit channel words:

TABLE III

| source words | unmodified coding | modified coding |
|---|---|---|
| 11 11 11 | 000 000 000 | 000 010 010 |
| 11 11 10 | 000 000 001 | 001 010 010 |
| 01 11 10 | 100 000 001 | 101 010 010 |
| 01 11 11 | 100 000 000 | 100 010 010 |

The logic circuit LC" is adapted to convert in a modified coding mode, the blocks of three 2-bit source words given in the left column of the above table III into the blocks of three 3-bit channel words as given in the right column in the above table. By realizing the modified encoding as per table III, a channel signal has been obtained which satisfies the k=8 constraint. Moreover, the modified encoding in the same way is parity preserving. This means in the present situation that, if the number of 'ones' in the combination of three 2-bit source words is odd (even), the number of 'ones' in the combination of the three 3-bit channel words obtained is odd (even). Further, two of the three 2-bit source words, which is in the above table the second one and the third one, is encoded into a 3-bit channel word which is unequal to one of the four channel words of table I. The reason for this is that on the receiver side, a detection of these two consecutive 3-bit channel words not belonging to the set of four 3-bit channel words of the table I is possible, so that a corresponding decoding, which is the inverse of the encoding as defined with reference to table III, can be realized.

The combination of three 3-bit channel words obtained by means of the encoding in conformity with table III, is supplied by the logic circuit LC" to its outputs $o_1$ to $o_9$, which channel words are supplied to the nine cells $Y_1$ to $Y_9$ of the shift register 4". The serial datastream of the channel signal C is supplied to the output terminal 8.

It will be evident that, in the same way as described with reference to FIG. 2b, the detection of the violation of the k-constraint can be done on the channel signal level, instead of the source signal level.

It has been said previously that other conversion rules for converting single 2-bit source words into single 3-bit channel words are possible. Those conversion rules are given in the following three tables.

TABLE IV

| source word ($x_1,x_2$) | | channel word ($y_1,y_2,y_3$) | |
|---|---|---|---|
| $SW_1$ | 00 | $CW_1$ | 101 |
| $SW_2$ | 01 | $CW_2$ | 001 |
| $SW_3$ | 10 | $CW_3$ | 100 |

TABLE IV-continued

| source word $(x_1,x_2)$ | | channel word $(y_1,y_2,y_3)$ | |
|---|---|---|---|
| $SW_4$ | 11 | $CW_4$ | 000 |

TABLE V

| source word $(x_1,x_2)$ | | channel word $(y_1,y_2,y_3)$ | |
|---|---|---|---|
| $SW_1$ | 00 | $CW_1$ | 000 |
| $SW_2$ | 01 | $CW_2$ | 100 |
| $SW_3$ | 10 | $CW_3$ | 001 |
| $SW_4$ | 11 | $CW_4$ | 101 |

TABLE VI

| source word $(x_1,x_2)$ | | channel word $(y_1,y_2,y_3)$ | |
|---|---|---|---|
| $SW_1$ | 00 | $CW_1$ | 000 |
| $SW_2$ | 01 | $CW_2$ | 001 |
| $SW_3$ | 10 | $CW_3$ | 100 |
| $SW_4$ | 11 | $CW_4$ | 101 |

It is evident that extensions of those conversion rules for encoding blocks of two or three 2-bit source words into blocks of two or three 3-bit channel words can be obtained using the teachings given above.

A further embodiment of an encoder is explained with reference to the following table VII. This table shows the conversion rule for an encoder capable of encoding 3-bit source words into 4-bit channel words.

TABLE VII

| source word $(x_1,x_2,x_3)$ | | channel word $(y_1,y_2,y_3,y_4)$ | |
|---|---|---|---|
| $SW_1$ | 000 | $CW_1$ | 0000 |
| $SW_2$ | 001 | $CW_2$ | 0001 |
| $SW_3$ | 010 | $CW_3$ | 0100 |
| $SW_4$ | 011 | $CW_4$ | 0101 |
| $SW_5$ | 100 | $CW_5$ | 1000 |
| $SW_6$ | 101 | $CW_6$ | 1001 |
| $SW_7$ | 110 | $CW_7$ | 1010 |
| $SW_8$ | 111 | $CW_8$ | 0010 |

Figure 4:
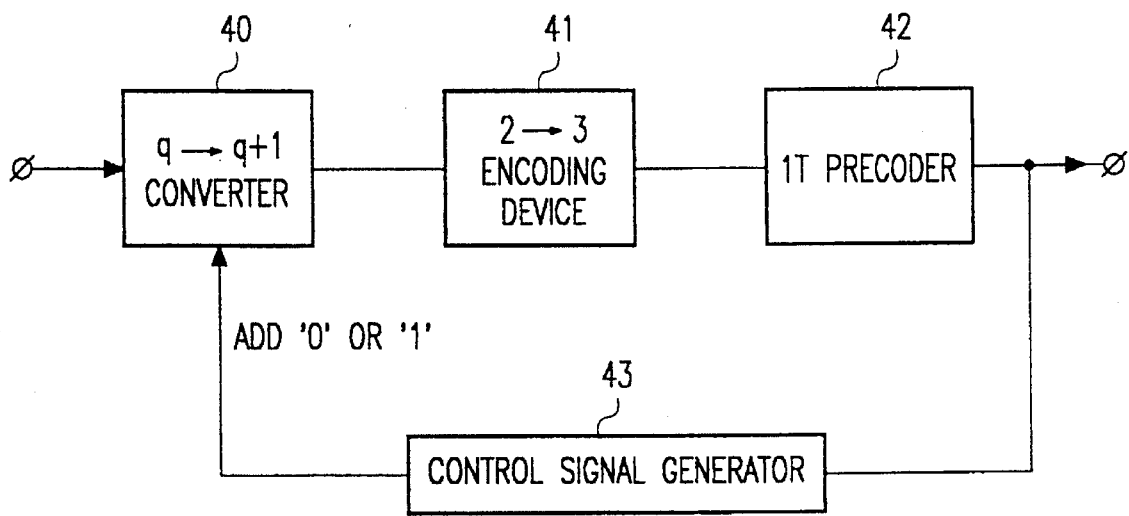
FIG. 4 shows the application of the device in an arrangement for inserting one bit on equidistant positions in the serial source signal.

As has been said previously, the devices described above are very suitable for including in the encoding arrangement where one bit is inserted after each q bits in a serial datastream in order to realize a polarity conversion, or not. Such an encoding arrangement is schematically shown in FIG. 4, where the encoder 40 is followed by the encoding device in accordance with the present invention 41, and a 1T-precoder 42, well known in the art. The output signal of the 1T precoder 42 is applied to a control signal generator 43, which generates the control signal for the converter 40, so as to control whether a '0' or a '1' is inserted in the serial datastream applied to the converter 40. The encoding device 41 can be inserted between the converter 40 and the 1t-precoder 42 without any modification, as the encoder 41 does not influence the polarity of the signal generated by the converter 40. By means of the arrangement shown in FIG. 4 it is possible to embed a tracking tone of a certain frequency in the serial datastream, or keep the DC content of the datastream to zero. Further, when the encoding device 41 is adapted to generate a (d,k) sequence as explained above, it causes the output signal of the arrangement of FIG. 4 to be a (d,k) RLL output signal. Embodiments of the converter 40 are given in Bell System Technical Journal, Vol 53, No. 6, pp. 1103–1106.

Figure 5:
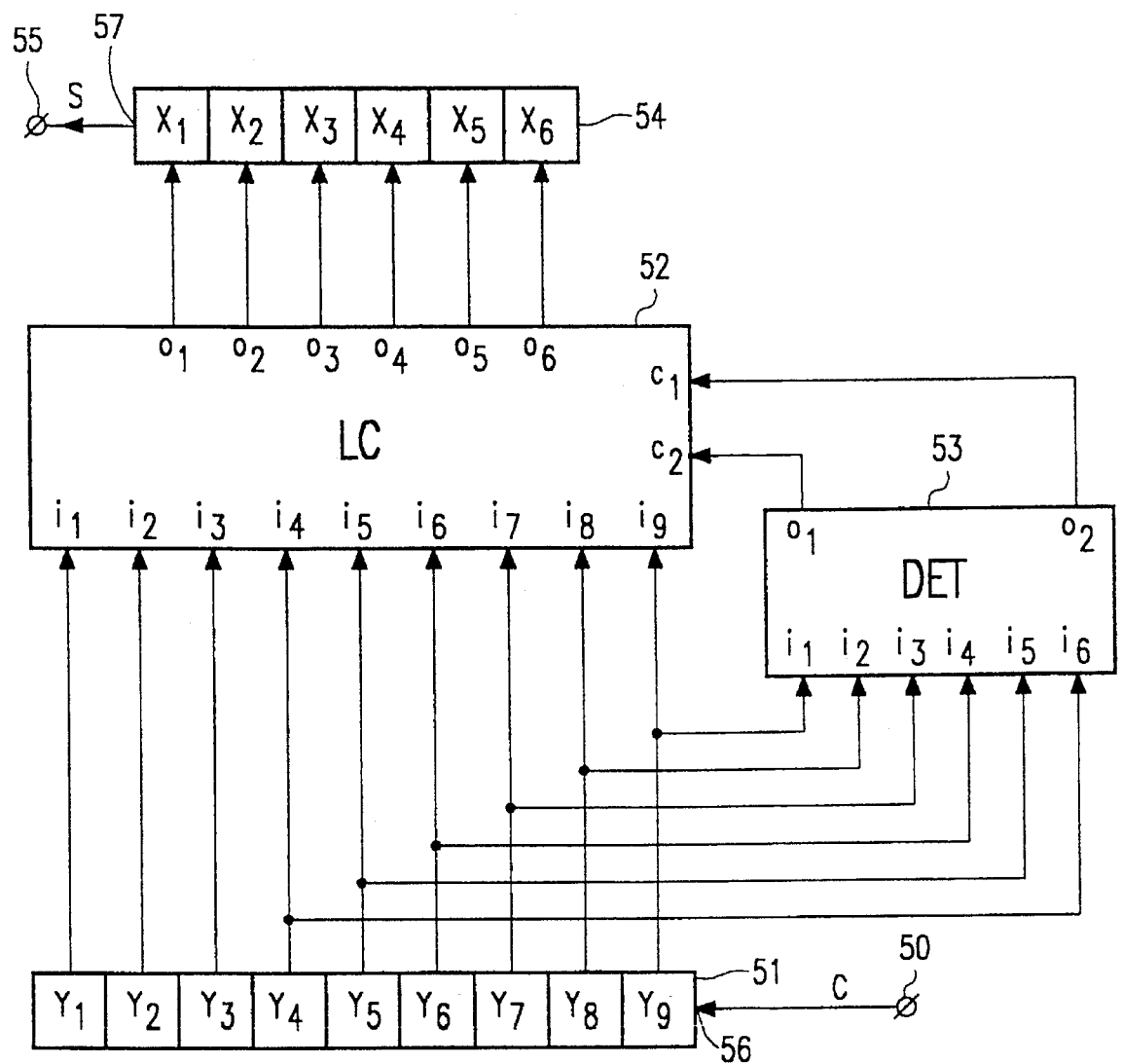
FIG. 5 an embodiment of the decoding device.

FIG. 5 shows a decoding device for decoding the serial datastream obtained by the encoding device of FIG. 3 so as to obtain a binary source signal. The decoding device has an input terminal 50 for receiving the channel signal, which input terminal 50 is coupled to an input 56 of a shift register 51, comprising nine cells $Y_1$ to $Y_9$. The shift register 51 functions as a serial-parallel converter so that blocks of three 3-bit channel words are applied to inputs $i_1$ to $i_9$ of a logic circuit 52. The logic circuit 52 comprises the three tables I, II and III. Outputs $o_1$ to $o_6$ of the logic circuit 52 are coupled to inputs of cells $X_1$ to $X_6$ of a shift register 54, which has an output 57 coupled to an output terminal 55. A detector circuit 53 is present having inputs $i_1$ to $i_6$ coupled to outputs of cells $Y_4$ to $Y_9$ respectively of the shift register 51, and outputs $o_1$ and $o_2$ coupled to control inputs $c_1$ and $c_2$ respectively of the logic circuit 52. The detector circuit 53 is capable of detecting a '010' bit pattern in the cells $Y_4$, $Y_5$ and $Y_6$ of the shift register 51 and is capable of detecting a bit pattern '010010' in the cells $Y_4$ to $Y_9$ of the shift register 51.

Upon detection of the '010010' bitpattern, the detector circuit 53 generates a control signal on its output $o_2$, and upon detection of a '010' bit pattern in the cells $Y_4$, $Y_5$ and $Y_6$, whilst there is no '010' bit pattern in the cells $Y_7$, $Y_8$ and $Y_9$, it generates a control signal on its output $o_1$.

In the absence of the control signals, the logic circuit 52 converts the 3-bit channel word stored in the cells $Y_1$, $Y_2$ and $Y_3$ into its corresponding 2-bit source word, as per the conversion table I, and supplies the 2-bit source word to the cells $X_1$ and $X_2$. In the presence of the control signal at the input $c_1$, the logic circuit 52 converts the block of two 3-bit channel words stored in the cells $Y_1$ to $Y_6$ into a block of two 2-bit source words, as per the conversion table II, and supplies the two 2-bit source words to the cells $X_1$ to $X_4$. In the presence of the control signal at the input $c_2$, the logic circuit 52 converts the block of three 3-bit channel words stored in the cells $Y_1$ to $Y_9$ into a block of three 2-bit source words, as per the conversion table III, and supplies the three 2-bit source words to the cells $X_1$ to $X_6$. In this way, the serial datastream of the channel signal is converted into the serial datastream of the source signal.

We claim:

1. A device for encoding a stream of databits of a binary source signal into a stream of databits of a binary channel signal, wherein the bitstream of the source signal is divided into n-bit source words, which device comprises converting means adapted to convert said source words into corresponding m-bit channel words, characterized in that, the converting means are adapted to convert a block of p consecutive n-bit source words into a corresponding block of p consecutive m-bit channel words, such that the conversion for each block of p consecutive n-bit source words is parity preserving, where n, m and p are integers, $m>n\geq 1$, $p\geq 1$, and where p can vary.

2. A device as claimed in claim 1, characterized in that, $m=n+1$.

3. A device as claimed in claim 2, characterized in that, $n=2$.

4. Device as claimed in claim 3, characterized in that, the device is adapted to convert single source words into corresponding single channel words in accordance with the following table:

| source word | | channel word | |
|---|---|---|---|
| SW$_1$ | 00 | CW$_1$ | 101 |
| SW$_2$ | 01 | CW$_2$ | 100 |
| SW$_3$ | 10 | CW$_3$ | 001 |
| SW$_4$ | 11 | CW$_4$ | 000. |

5. A device as claimed in claim 3, wherein the converting means are adapted to convert 2-bit source words into corresponding 3-bit channel words, so as to obtain a channel signal in the form of a (d,k) sequence, where d=1, the device further comprising means for detecting the position in the bitstream of the source signal where encoding of single 2-bit source words into corresponding single channel words would lead to a violation of the d-constraint at the channel word boundaries and for supplying a control signal in response to said detection, characterized in that, in the absence of the control signal, the converting means are adapted to convert single 2-bit source words into corresponding single 3-bit channel words, such that the conversion for each 2-bit source word is parity preserving.

6. Device as claimed in claim 5, wherein, in the presence of the control signal, occurring during the conversion of two consecutive source words, the converting means are adapted to convert a block of said two consecutive 2-bit source words into a block of two corresponding 3-bit channel words, such that one of the two source words in the block of source words is converted into a 3-bit channel word which is not identical to one of the four channel words CW$_1$ to CW$_4$, in order to preserve the d=1 constraint, characterized in that, in the presence of said control signal, the converting means are further adapted to convert the block of said two subsequent 2-bit source words into a corresponding block of two subsequent 3-bit channel words, such that the conversion for said block of two subsequent 2-bit source words is parity preserving.

7. Device as claimed in claim 6, characterized in that, the converting means are adapted to convert the blocks of two consecutive 2-bit source words into the blocks of two consecutive 3-bit channel words in accordance with the coding given in the following table:

| block of 2 source words | block of 2 channel words |
|---|---|
| 00 00 | 100 010 |
| 00 01 | 101 010 |
| 10 00 | 000 010 |
| 10 01 | 001 010. |

8. Device as claimed in claim 6, where k has a value larger than 5, the device being further provided with means for detecting the position in the bitstream of the source signal where encoding of single 2-bit source words into single 3-bit channel words would lead to a violation of the k-constraint and for supplying a second control signal in response to said detection, characterized in that, in the presence of the second control signal, occurring during the conversion of three consecutive 2-bit source words, the converting means are adapted to convert a block of said three consecutive 2-bit source words into a block of corresponding three consecutive 3-bit channel words, such that the conversion for said block of three 2-bit source words is parity preserving, the converting means are further adapted to convert two of the three source words in the block into corresponding 3-bit channel words not identical to the four channel words CW$_1$ to CW$_4$, in order to preserve the k constraint.

9. Device as claimed in claim 8, characterized in that, the converting means are adapted to convert blocks of three consecutive 2-bit source words into blocks of three consecutive 3-bit channel words in accordance with the coding given in the following table:

| block of 3 source words | block of 3 channel words |
|---|---|
| 11 11 11 | 000 010 010 |
| 11 11 10 | 001 010 010 |
| 01 11 10 | 101 010 010 |
| 01 11 11 | 100 010 010. |

10. Device for decoding a stream of data bits of a binary channel signal obtained by means of the encoding device in accordance with claim 1, so as to obtain a stream of databits of a binary source signal.

11. Device for decoding a stream of data bits of a binary channel signal into a stream of databits of a binary source signal, wherein the bitstream of the channel signal is divided into m-bit channel words, which device comprises deconverting means adapted to deconvert m-bit channel words into corresponding n-bit source words, characterized in that, the deconverting means are adapted to deconvert a block of p consecutive m-bit channel words into a corresponding block of p consecutive n-bit source words, such that the conversion for each block of p consecutive m-bit channel words is parity preserving, where n, m and p are integers, m>n, p≧1, and where p can vary.

* * * * *